United States Patent
Xiang et al.

(10) Patent No.: US 10,276,254 B2
(45) Date of Patent: Apr. 30, 2019

(54) SHIFT REGISTER UNIT, ORGANIC LIGHT-EMITTING DISPLAY PANEL AND DRIVING METHOD

(71) Applicants: SHANGHAI TIANMA AM-OLED CO., LTD., Shanghai (CN); TIANMA MICRO-ELECTRONICS CO., LTD., Shenzhen (CN)

(72) Inventors: Dongxu Xiang, Shanghai (CN); Yue Li, Shanghai (CN); Dong Qian, Shanghai (CN); Gang Liu, Shanghai (CN)

(73) Assignees: SHANGHAI TIANMA AM-OLED CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 232 days.

(21) Appl. No.: 15/598,217

(22) Filed: May 17, 2017

(65) Prior Publication Data
US 2017/0256204 A1 Sep. 7, 2017

(30) Foreign Application Priority Data

Dec. 29, 2016 (CN) .......................... 2016 1 1245718

(51) Int. Cl.
| | | |
|---|---|---|
| *G11C 19/00* | (2006.01) | |
| *G11C 19/28* | (2006.01) | |
| *G09G 3/3266* | (2016.01) | |
| *G09G 3/36* | (2006.01) | |

(52) U.S. Cl.
CPC ......... *G11C 19/287* (2013.01); *G09G 3/3266* (2013.01); *G09G 3/3677* (2013.01); *G09G 2300/0809* (2013.01); *G09G 2310/0286* (2013.01); *G11C 19/28* (2013.01)

(58) Field of Classification Search
None
See application file for complete search history.

(56) References Cited

U.S. PATENT DOCUMENTS

| | | | | |
|---|---|---|---|---|
| 10,043,432 B2 * | 8/2018 | Lee | ........................... | G09G 3/20 |
| 2012/0176417 A1 * | 7/2012 | Jang | ..................... | G09G 3/3266 |
| | | | | 345/690 |
| 2013/0222352 A1 * | 8/2013 | Jeong | .................... | G09G 3/3266 |
| | | | | 345/205 |
| 2013/0342584 A1 * | 12/2013 | Song | ........................ | G09G 3/30 |
| | | | | 345/690 |

(Continued)

*Primary Examiner* — Tuan T Lam
(74) *Attorney, Agent, or Firm* — Alston & Bird LLP

(57) ABSTRACT

The present disclosure describes a shift register unit, an organic light-emitting display panel and a driving method. The shift register unit comprises a node potential controller and an output unit. The node potential controller comprises a first output end and a second output end. The output unit is configured to output, based on a first control signal from the first output end and a second control signal from the second output end, a first level signal or a second level signal. According to the solutions provided by the application, the potential of each node in the shift register unit is stable and controllable, and contributed to the avoidance of output logic execution problem in the shift register unit caused by unstable node potential when each control signal level of the shift register unit jumps.

12 Claims, 7 Drawing Sheets

(56) References Cited

U.S. PATENT DOCUMENTS

| | | | |
|---|---|---|---|
| 2014/0111092 A1* | 4/2014 | Kim | H05B 37/02 |
| | | | 315/127 |
| 2015/0155052 A1* | 6/2015 | Ma | G09G 3/36 |
| | | | 345/100 |
| 2017/0004771 A1* | 1/2017 | Lee | G09G 3/20 |
| 2017/0004775 A1* | 1/2017 | Chen | G09G 3/3266 |
| 2017/0004801 A1* | 1/2017 | Li | G11C 19/28 |
| 2017/0116920 A1* | 4/2017 | Kwon | G09G 3/3266 |
| 2017/0124936 A1* | 5/2017 | Tseng | G09G 3/2092 |
| 2017/0186360 A1* | 6/2017 | Ma | G11C 19/28 |
| 2017/0365211 A1* | 12/2017 | Lee | G09G 3/3233 |

* cited by examiner

SHIFT REGISTER UNIT, ORGANIC LIGHT-EMITTING DISPLAY PANEL AND DRIVING METHOD

CROSS-REFERENCE TO RELATED APPLICATION

This application is related to and claims priority from Chinese Patent Application No. CN201611245718.2, filed on Dec. 29, 2016, entitled "Shift Register Unit, Register, Organic Light-Emitting Display Panel and Driving Method," the entire disclosure of which is hereby incorporated by reference for all purposes.

TECHNICAL FIELD

The present disclosure generally relates to the field of display technologies, and more particularly, to a shift register unit, an organic light-emitting display panel, and a driving method.

BACKGROUND

With the constant development of display technologies, dimensions of display devices change every day. To meet portability of electronic devices, demands for small sized display screens keep increasing.

Meanwhile, users put forward higher requirements for the display screen quality. For example, the users prefer display screens with high pixel per inch (PPI) to enhance the display accuracy and coherence.

Organic light-emitting diode (OLED) displays are more and more widely used in various portable electronic devices due to its light weight, slim design, power saving and other characteristics.

The OLED display generally includes an OLED array (namely, a pixel array), driving circuits (namely, pixel circuits) providing driving current to each OLED in the array, and scanning circuits providing driving signals to each pixel circuit.

However, due to the circuit structure in an existing scanning circuit, problems during logic execution may occur. In addition, when threshold shift occurs in a transistor in the scanning circuit, the scanning circuit cannot output normally, resulting in a more complex and stringent scanning circuit fabrication process.

In view of the aforementioned disadvantages or deficiencies in the prior art, it is expected to provide a shift register unit, a register, an organic light-emitting display panel and a driving method to solve the technical problems in the prior art.

SUMMARY

In a first aspect, the present disclosure provides a shift register unit, which includes a node potential controller and an output unit. The node potential controller includes a first output end and a second output end. The output unit is configured to output, based on a first control signal outputted by the first output end and a second control signal outputted by the second output end, a first level signal or a second level signal. The node potential controller includes a first transistor, a second transistor, a third transistor, a fourth transistor, a fifth transistor, a sixth transistor, a seventh transistor, an eighth transistor, a ninth transistor, a tenth transistor, a first capacitor, a second capacitor and a third capacitor. A gate of the first transistor, a gate of the second transistor, a gate of the seventh transistor and a first electrode of the third transistor are electrically connected to a first clock signal control end, a first electrode of the first transistor and a first electrode of the seventh transistor are electrically connected to a first input signal end, and a second electrode of the first transistor is electrically connected to a gate of the third transistor. A first electrode of the second transistor is electrically connected to a first level signal end, and a second electrode of the second transistor is electrically connected to a gate of the sixth transistor. A second electrode of the third transistor is electrically connected to a gate of the fifth transistor and the gate of the sixth transistor. A gate of the fourth transistor is electrically connected to a second clock signal control end, a first electrode of the fourth transistor is electrically connected to a second electrode of the fifth transistor, and a second electrode of the fourth transistor is electrically connected to the first output end. A first electrode of the fifth transistor is electrically connected to a second level signal end. A first electrode of the sixth transistor is electrically connected to the second clock signal control end, and a second electrode of the sixth transistor is electrically connected to the second output end. A second electrode of the seventh transistor is electrically connected to the first output end. A gate of the eighth transistor is electrically connected to the first output end, a first electrode of the eighth transistor is electrically connected to the second level signal end, and a second electrode of the eighth transistor is electrically connected to the second output end. Two ends of the first capacitor are connected respectively to the second clock signal control end and the first output end. Two ends of the second capacitor are connected respectively to the gate of the fifth transistor and the second output end. Two ends of the third capacitor are connected respectively to the first electrode of the fifth transistor and the gate of the third transistor.

In a second aspect, the present disclosure further provides a shift register, which includes N cascaded shift register units. A first input signal end of an $(i+1)^{th}$ stage shift register unit receives an output signal of an $i^{th}$ stage shift register unit, wherein the i is an integer and satisfies: $1 \leq i \leq N-1$.

In a third aspect, the present disclosure further provides an organic light-emitting display panel, which includes: a pixel array, including m rows and n columns of pixel regions; and a plurality of pixel driving circuits, each of the pixel driving circuits including a light-emitting diode and a driver transistor configured to drive the light-emitting diode, each of the light-emitting diodes being positioned within each of the pixel regions. The organic light-emitting display panel further includes a plurality of control signal lines and light emitting control signal lines, wherein, each of the pixel driving circuits is electrically connected to one of the light emitting control signal lines and receives a light emitting control signal outputted by the shift register unit according to any one of claims 1-7.

In a fourth aspect, the present disclosure further provides a driving method, which is used for driving the shift register unit, the method includes: inputting the first level signal to the first input signal end and the second clock signal control end and inputting the second level signal to the first clock signal control end in a first phase so that the first output end and the second output end maintain a current output voltage; inputting the first level signal to the first clock signal control end and inputting the second level signal to the second clock signal control end in a second phase so that the first output end outputs the first level signal and the second output end outputs the second level signal; inputting the second level signal to the first input signal end and the first clock signal control end and inputting the first level signal to the second clock signal control end in a third phase so that the first output end outputs the second level signal, and the second output end outputs the first level signal; and inputting the second level signal to the first input signal end and the second clock signal control end and inputting the first level signal to the first clock signal control end in a fourth phase, so that the first output end outputs the second level signal and the second output end outputs the first level signal.

According to the present disclosure, the potential of each node in the shift register unit is stable and controllable, and is contributed to the avoidance of output logic execution problem in the shift register unit caused by unstable node potential when each control signal level of the shift register unit jumps. In addition, the shift register unit of the present disclosure provides robustness against a transistor threshold shift. The shift register unit may still work properly within a certain threshold shift range when the transistor threshold shift, resulting in a reduction of the complexity in the shift register unit fabrication process.

BRIEF DESCRIPTION OF THE DRAWINGS

By reading the detailed description of non-limiting embodiments with reference to the following accompanying drawings, other features, objectives and advantages of the present disclosure will become more apparent.

DETAILED DESCRIPTION OF EMBODIMENTS

The present application will be further described below in detail in combination with the accompanying drawings and the embodiments. It should be appreciated that the specific embodiments described herein are merely used for explaining the relevant invention, rather than limiting the invention. In addition, it should be noted that, for the ease of description, only the parts related to the relevant invention are shown in the accompanying drawings.

It should also be noted that the embodiments in the present application and the features in the embodiments may be combined with each other on a non-conflict basis. The present application will be described below in detail with reference to the accompanying drawings and in combination with the embodiments.

Figure 1:
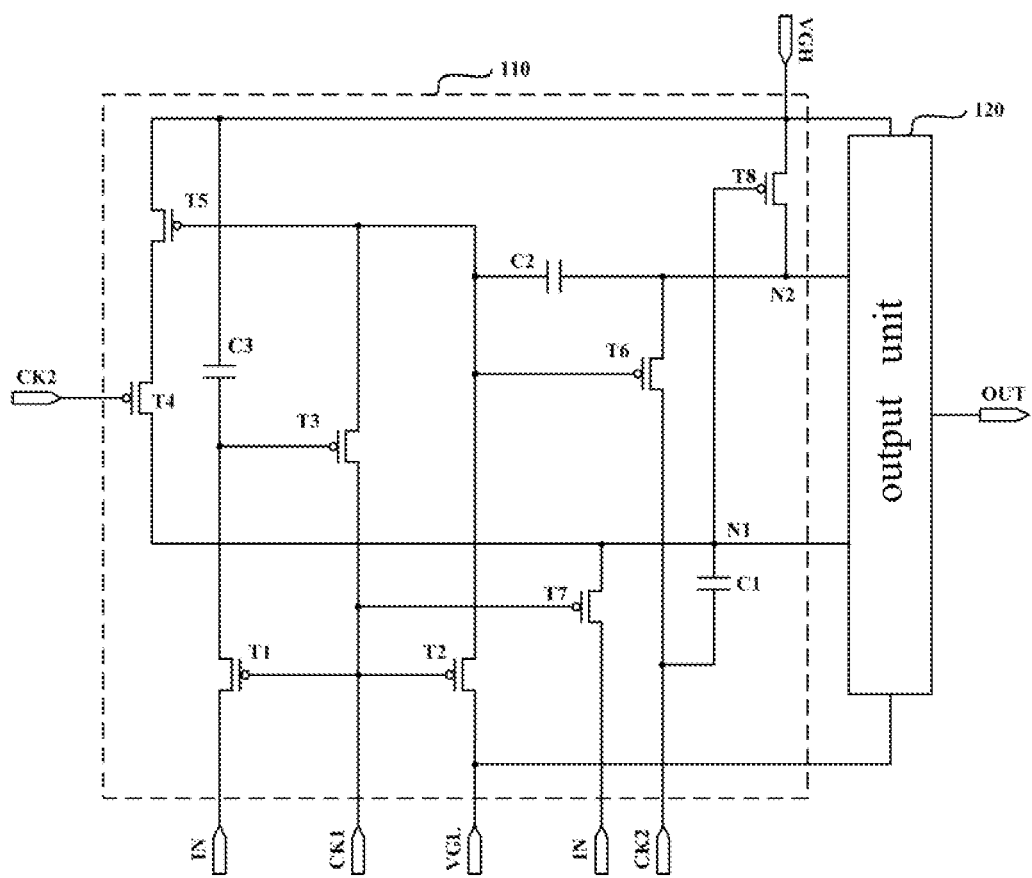
FIG. 1 illustrates a schematic structural diagram of a shift register unit according to an embodiment of the present disclosure.

Referring to FIG. 1, which is a schematic structural diagram of a shift register unit according to an embodiment of the present disclosure.

The shift register unit includes a node potential controller 110 and an output unit 120.

The node potential controller 110 includes a first output end N1 and a second output end N2.

The output unit 120 is configured to output a first level signal or a second level signal, based on a first control signal outputted by the first output end N1 of the node potential controller 110, and a second control signal outputted by the second output end N2 of the node potential controller 110.

The node potential controller 110 includes a first transistor T1, a second transistor T2, a third transistor T3, a fourth transistor T4, a fifth transistor T5, a sixth transistor T6, a seventh transistor T7, an eighth transistor T8, a first capacitor C1, a second capacitor C2 and a third capacitor C3.

A gate of the first transistor T1, a gate of the second transistor T2, a gate of the seventh transistor T7 and a first electrode of the third transistor T3 are electrically connected to a first clock signal control end CK1. A first electrode of the first transistor T1 and a first electrode of the seventh transistor T7 are electrically connected to a first input signal end IN, and a second electrode of the first transistor T1 is electrically connected to a gate of the third transistor T3.

A first electrode of the second transistor T2 is electrically connected to a first level signal end VGL, and a second electrode of the second transistor T2 is electrically connected to a gate of the sixth transistor T6.

A second electrode of the third transistor T3 is electrically connected to a gate of the fifth transistor T5 and the gate of the sixth transistor T6.

A gate of the fourth transistor T4 is electrically connected to a second clock signal control end CK2, a first electrode of the fourth transistor T4 is electrically connected to a second electrode of the fifth transistor T5, and a second electrode of the fourth transistor T4 is electrically connected to the first output end N1.

A first electrode of the fifth transistor T5 is electrically connected to a second level signal end VGH.

A first electrode of the sixth transistor T6 is electrically connected to the second clock signal control end CK2, and a second electrode of the sixth transistor T6 is electrically connected to the second output end N2.

A second electrode of the seventh transistor T7 is electrically connected to the first output end N1.

A gate of the eighth transistor T8 is electrically connected to the first output end N1, a first electrode of the eighth transistor T8 is electrically connected to the second level signal end VGH, and a second electrode of the eighth transistor T8 is electrically connected to the second output end N2.

Two ends of the first capacitor C1 are connected to the second clock signal control end CK2 and the first output end N1, respectively.

Two ends of the second capacitor C2 are connected to the gate of the fifth transistor T5 and the second output end N2, respectively.

Two ends of the third capacitor C3 are connected to the first electrode of the fifth transistor T5 and the gate of the third transistor T3, respectively.

In the shift register unit of this embodiment, by setting the first capacitor C1, the second capacitor C2 and the third capacitor C3 at appropriate locations, when a given end of the capacitors is floating, a coupling effect of the capacitors is utilized so that the floating end may drop or rise with the voltage at the other end of the capacitors, to ensure that a transistor electrically connected to the capacitors maintains an on or off state and no malfunction occurs. In this way, it is ensured that the first output end N1 and the second output end N2 of the node controller 110 output a correct level. The accuracy of the signal outputted by the output end OUT of the shift register unit is guaranteed.

Figure 2:
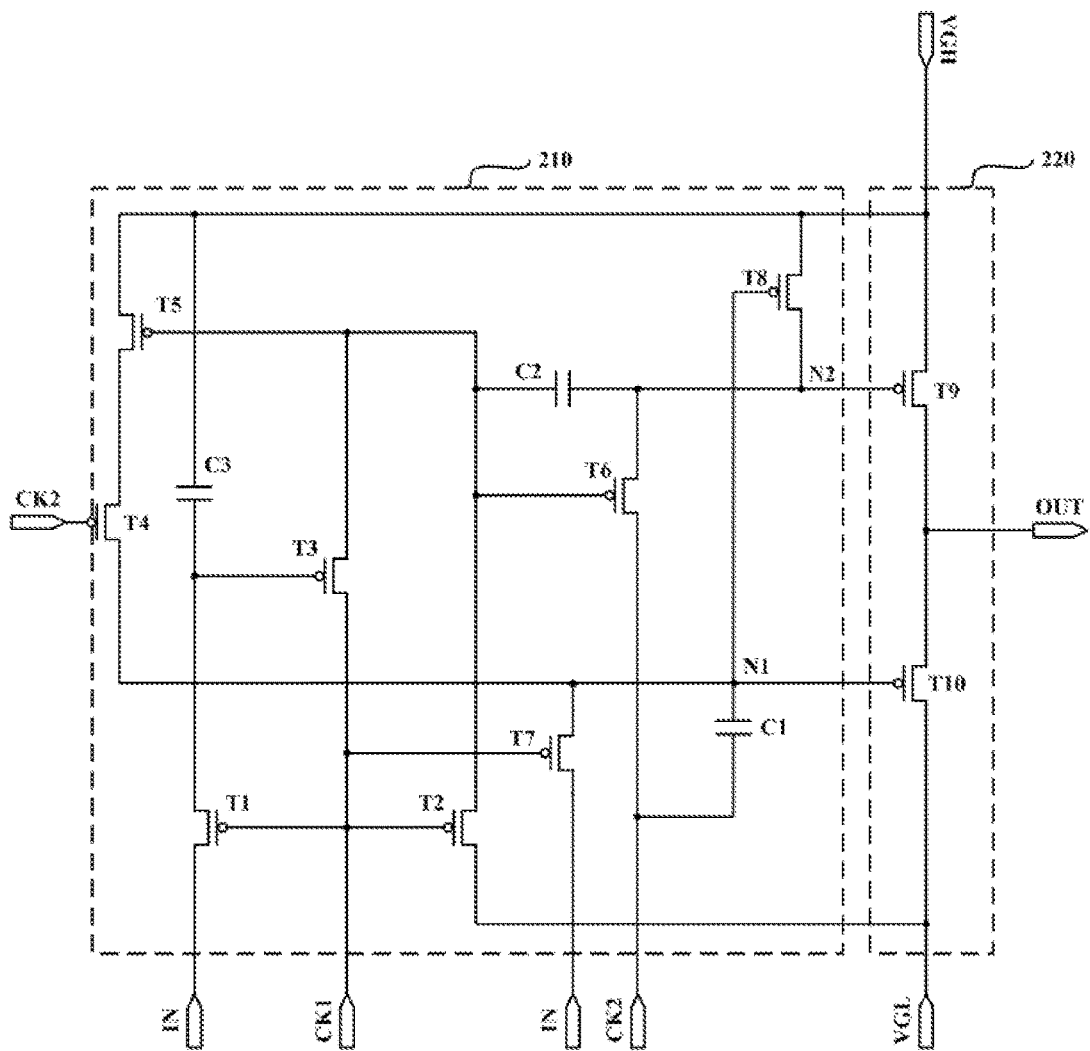
FIG. 2 illustrates a schematic structural diagram of a shift register unit according to another embodiment of the present disclosure.

Referring to FIG. 2, which is a schematic structural diagram of a shift register unit according to another embodiment of the present disclosure.

Similar to the embodiment as shown in FIG. 1, the shift register unit of this embodiment also includes a node potential controller 210 and an output unit 220. The node potential controller 210 has a structure identical to the structure in the embodiment as shown in FIG. 1, and also includes the first output end N1 and the second output end N2.

Further description of the structure of the output unit 220 is made in this embodiment to differentiate the embodiment as shown in FIG. 1.

Specifically, the output unit 220 of this embodiment includes a ninth transistor T9 and a tenth transistor T10.

A gate of the ninth transistor T9 is electrically connected to the second output end N2 of the node potential controller 210, a first electrode of the ninth transistor T9 is electrically connected to the second level signal end VGH, and a second electrode of the ninth transistor T9 and a second electrode of the tenth transistor T10 are connected electrically to an output end OUT of the output unit 220.

A gate of the tenth transistor T10 is electrically connected to the first output end N1 of the node potential controller 220, a first electrode of the tenth transistor T10 is electrically connected to the first level signal end VGL.

Similar to the embodiment as shown in FIG. 1, in the shift register unit of this embodiment, by setting the first capacitor C1 and the second capacitor C2 at appropriate locations, when a given end of the capacitors is floating, a coupling effect of the capacitor is utilized so that the floating end may lower or rise with the voltage at the other end of the capacitor, to ensure that a transistor electrically connected to the capacitor maintains an on or off state and no malfunction occurs. In this way, it is ensured that the first output end N1 and the second output end N2 of the node controller 110 output a correct level, and further it is ensured an accuracy of the output end OUT of the shift register unit in outputting a signal. In another aspect, by setting the third capacitor C3, a gate potential of the third transistor T3 may be maintained, and it is avoidable that occurrence of turning on or off the third transistor T3 by mistake is caused by jitter of the gate potential of the third transistor T3.

Figure 3:
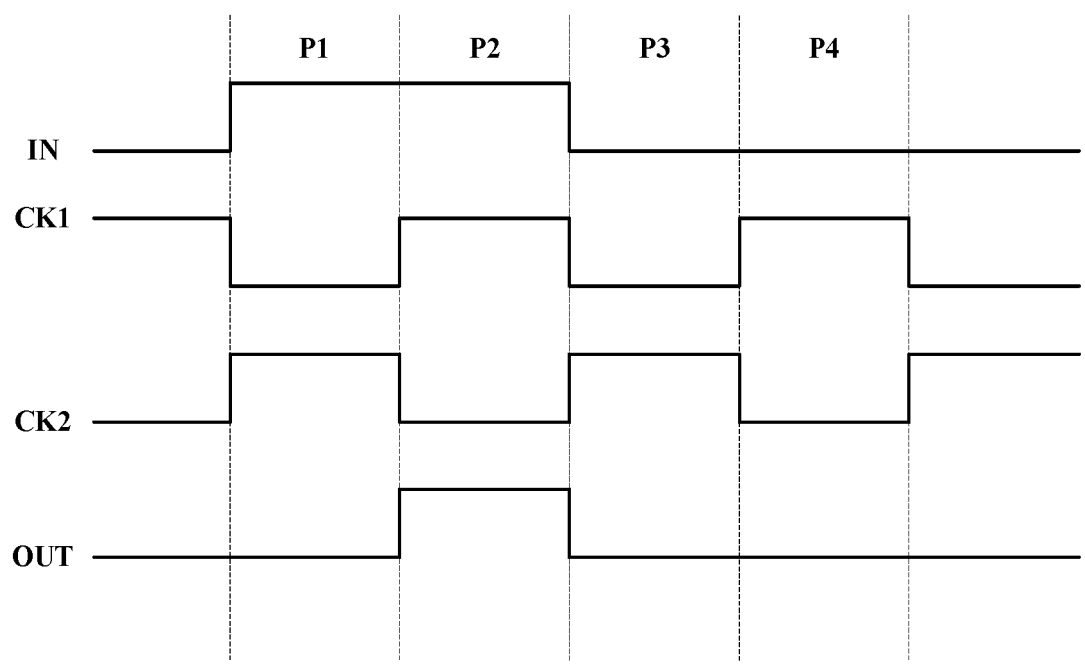
FIG. 3 illustrates a schematic timing diagram of each driving signal for driving the shift register unit as shown in FIG. 2.

In the following, the shift register unit of this embodiment will be further described in detail with reference to the timing diagram as shown in FIG. 3, to further highlight the technical effects. In the following description of FIG. 3, each transistor in the shift register unit as a PMOS transistor, the input signal of the first level signal end VGL as a low level signal, and the input signal of the second level signal end VGH as a high level signal are used to describe the examples.

As shown in FIG. 3, both the first clock signal inputted by a first clock control signal end CK1, and the second clock signal inputted by a second clock signal end CK2 are periodic square-wave signals.

In phase P1, a high level signal is inputted by the first input signal end IN, a second clock signal inputted by the second clock signal end CK2 is a high level signal, a first clock signal inputted by the first clock control signal end CK1 is a low level signal, the first transistor T1, the second transistor T2 and the seventh transistor T7 are turned on. A high level signal is written into the gate of the third transistor T3 and the first output end N1. Therefore, the third transistor T3 is turned off. Meanwhile, the second transistor T2 is turned on so that the low level signal inputted by the first level signal end VGL is provided to the gate of the sixth transistor T6, and thus the sixth transistor T6 is turned on and provides the high level signal inputted by the second clock signal end CK2 to the second output end N2. Therefore, in phase T1, when the first clock signal inputted by the first clock signal end CK1 jumps to a low level, both the first output end N1 and the second output end N2 output a high level signal, both the ninth transistor T9 and the tenth transistor T10 are turned off, and the output signal of the output end OUT of the shift register unit maintains the output of a previous phase.

Then, in phase P2, the first clock signal inputted by the first clock signal end CK1 is a high level signal, the second clock signal inputted by the second clock signal end CK2 is a low level signal, the fourth transistor T4 is turned on, and the first transistor T1, the second transistor T2 and the seventh transistor T7 are turned off. The fifth transistor T5 and the sixth transistor T6 are turned on since their gates are in a floating state at the moment and maintain a low level in phase P1. As thus, the low level signal inputted by the second clock signal end CK2 is provided to the second output end N2. Under the control of the low level of the second output end N2, the ninth transistor T9 is turned on, so that the high level signal inputted by the second level signal end VGH is provided to the output end OUT of the shift register unit. In addition, due to the coupling effect of the second capacitor C2, gate potentials of the fifth transistor T5 and the sixth transistor T6 will be further lowered to ensure that both the fifth transistor T5 and the sixth transistor T6 are turned on in this phase, and the low level signal inputted by the second clock signal end CK2 may be completely written into the second output end N2. In another aspect, due to the action of holding the potential by the third capacitor C3, the gate of the third transistor T3 maintains a high level, thereby avoiding the occurrence of the fifth transistor T5 and the sixth transistor T6 being turned off due to a rise of the gate voltages of the fifth transistor T5 and the sixth transistor T6 caused by mistakenly turning on the third transistor T3.

Then, in phase P3, the first clock signal inputted by the first clock signal end CK1 jumps to a low level signal. Meanwhile, the first input signal end IN inputs a low level signal, and the second clock signal inputted by the second clock signal end CK2 is a high level signal. At this moment, the first transistor T1, the second transistor T2 and the seventh transistor T7 are turned on so that the low level signal is provided to the first output end N1. Meanwhile, the low level signal of the first output end N1 allows the eighth transistor T8 to be turned on, so that the high level signal inputted by the second level signal end VGH is provided to the second output end N2. As thus, the ninth transistor T9 is turned off but the tenth transistor T10 is turned on, so that the output end OUT of the shift register unit outputs a low level signal.

Next, in P4 phase, the first clock signal inputted by the first clock signal end CK1 jumps to a high level signal, the second clock signal inputted by the second clock signal end CK2 jumps to a low level signal, and a signal inputted by the first input signal end IN is a low level signal. At this moment, the first transistor T1 is turned off. Since the third capacitor C3 is capable of stabilizing the potential, the gate of the third transistor T3 can maintain the low level in phase P3, so that the third transistor T3 is turned on, and the high level signal inputted by the first clock signal end CK1 is transmitted to the gates of the fifth transistor T5 and the sixth transistor T6 so that the fifth transistor T5 and the sixth transistor T6 are turned off. Meanwhile, the first output end N1 maintains the low level in phase P3 since it is in the floating state. At the same time, the low level signal of the first output end N1 allows the eighth transistor T8 to be turned on, so that the high level signal inputted by the second level signal end VGH is provided to the second output end N2. As thus, the ninth transistor T9 is turned off but the tenth transistor T10 is turned on, so that the output end OUT of the shift register unit keeps outputting a low level signal. In addition, because of the coupling effect of the first capacitor C1 and because what is inputted at the moment by the second clock signal end CK2 connected to one end of the first capacitor C1 is a low level, the first capacitor C1 may further lower the potential of the first output end N1. In this way, it is ensured that the tenth transistor T10 is turned on and the output end OUT of the shift register unit keeps outputting a low level signal.

As can be seen from the above analysis, in the shift register unit of this embodiment, the coupling effect of the first capacitor C1 and the second capacitor C2 is utilized, to ensure that a transistor electrically connected to each capacitor maintains an on or off state and no malfunction occurs. This, in turn, ensures that the first output end N1 and the second output end N2 of the node controller 210 output a correct level, and further ensures an accuracy of the output end OUT of the shift register unit in outputting the signal. In another aspect, because of the coupling effect of the first capacitor C1 and the second capacitor C2, when transistors electrically connected to the two capacitors are turned on, gate potentials of these transistors may be further lowered. As thus, even though threshold shift occur in these transistors, these transistors still may be turned on or off according to a pre-established logical sequence when the threshold shift is within a certain range (for example, ±1.5V), thereby ensuring accuracy of the output end OUT of the shift register unit in outputting a signal. In another aspect, by setting the third capacitor C3, the gate potential of the third transistor T3 can be maintained, to avoid the occurrence of mistakenly turning on or off the third transistor T3 caused by the jitter of the gate potential of the third transistor T3.

In addition, after a signal inputted by the first input signal end IN jumps to a high level, a rising edge of an output end OUT signal of the shift register unit corresponds to a first falling edge of the second clock signal inputted by the second clock signal end CK2, and a falling edge of the output end OUT signal of the shift register unit corresponds to a first falling edge of the first clock signal inputted by the first clock signal end CK1. Therefore, by adjusting phases of the first clock signal and the second clock signal, the time of outputting the high level by the output signal and the duty cycle of the output signal can be changed.

Figure 4:
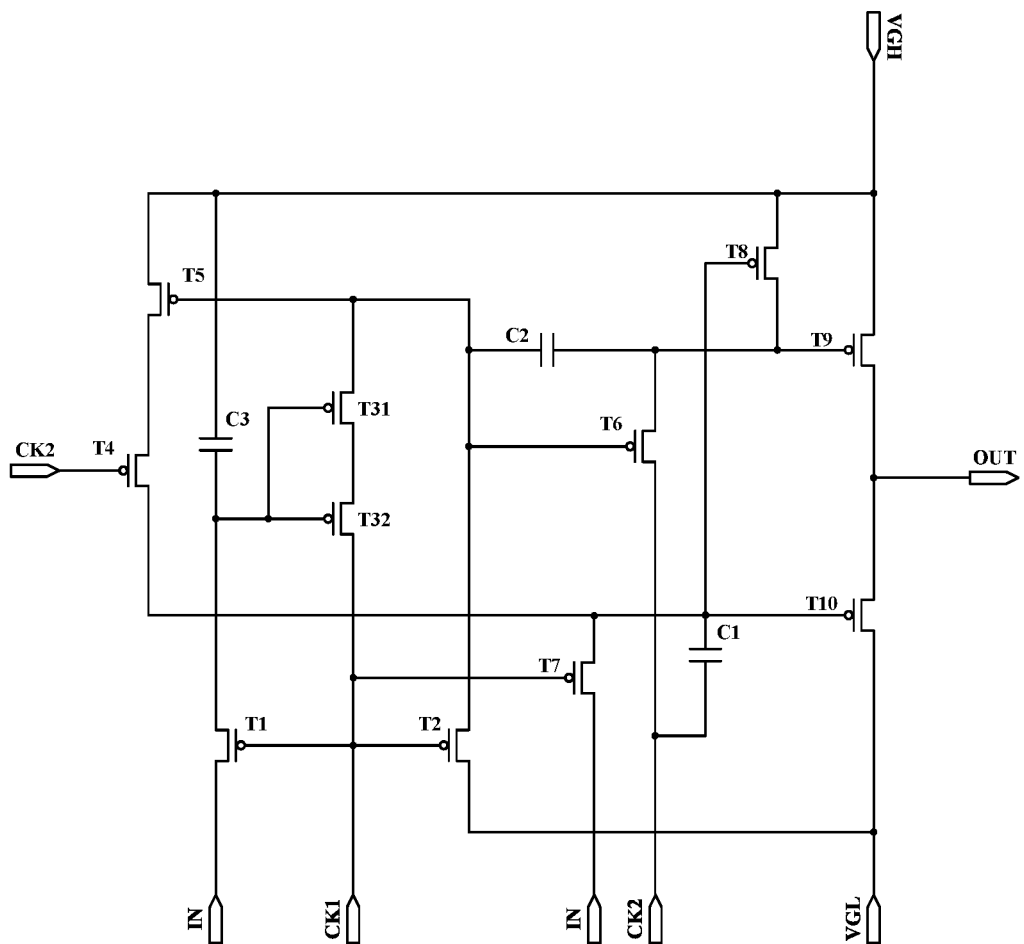
FIG. 4 illustrates a schematic structural diagram of a shift register unit according to still another embodiment of the present disclosure.

FIG. 4 is a schematic structural diagram of a shift register unit according to still another embodiment of the present disclosure.

The shift register unit of this embodiment has a structural diagram similar to that of the shift register unit as shown in FIG. 2, and a signal inputted by each signal end maybe driven and controlled using the timing sequence as shown in FIG. 3. The difference merely resides in that the third transistor in this embodiment in FIG. 4 is a double-gate transistor. That is, in the shift register unit of this embodiment, the third transistor includes two transistors T31 and T32 having a common gate.

Specifically, referring to FIG. 4, in this embodiment, the gates of the transistor T31 and the transistor T32 electrically are interconnected, and are electrically connected to the second electrode of the first transistor T1. The second electrode of the transistor T31 is electrically connected to the gates of the fifth transistor T5 and the sixth transistor T6. The first electrode of the transistor T31 is electrically interconnected to the second electrode of the transistor T32, and the first electrode of the transistor T32 is electrically connected to the first clock signal end CK1.

In the shift register unit of this embodiment, the third transistor adopts the double-gate transistor, which may avoid occurrence of breakdown of the third transistor in case that a large cross voltage exists between the gate of the fifth transistor T5 and the first clock signal inputted by the first clock signal end CK1, thereby ensuring steady operation of the shift register unit.

In addition, in some alternative embodiments, in the shift register unit of each embodiment of the present disclosure, all transistors from T1 to T10 may be PMOS transistors. In other alternative embodiments, in the shift register unit of each embodiment of the present disclosure, all transistors from T1 to T10 may be NMOS transistors.

As thus, all transistors T1 to T10 have the same channel type, resulting in a reduction of difficulty in the fabrication process of the shift register unit in the present disclosure and thus an improvement of the yield of product.

In some alternative embodiments, in the shift register unit of each embodiment of the present disclosure, the first clock control signal inputted by the first clock signal control end CK1 and the second clock control signal inputted by the second clock signal control end CK2 may be mutually-inverted signals. As thus, a signal (for example, the first clock signal) may be outputted by a signal source, and then another signal (for example, the second clock signal) maybe obtained by means of a simple logical operation (for example, an inverting operation).

In some alternative embodiments, a capacitance value of the first capacitor C1 may be positively correlated with a width-to-length ratio of the tenth transistor to make the coupling effect of the first capacitor C1 more remarkable so that the potential of the first output end of the node potential controller is more stable and controllable.

In some alternative embodiments, in each embodiment of the present disclosure, the width-to-length ratio w/l of the gate channel of the first transistor T1 may satisfy: $1.5 \leq w/l \leq 2$. As thus, since the first transistor T1 has a smaller width-to-length ratio, when the first transistor T1 is turned off (for example, in phase P2 and phase P4 as shown in FIG. 3), the leakage current flowing through the first transistor is correspondingly smaller, which avoids lifting the gate potential of the third transistor T3 by charging the third capacitor C3 by the leakage current, thereby avoiding occurrence of turning off the third transistor T3 by mistake.

Figure 5:
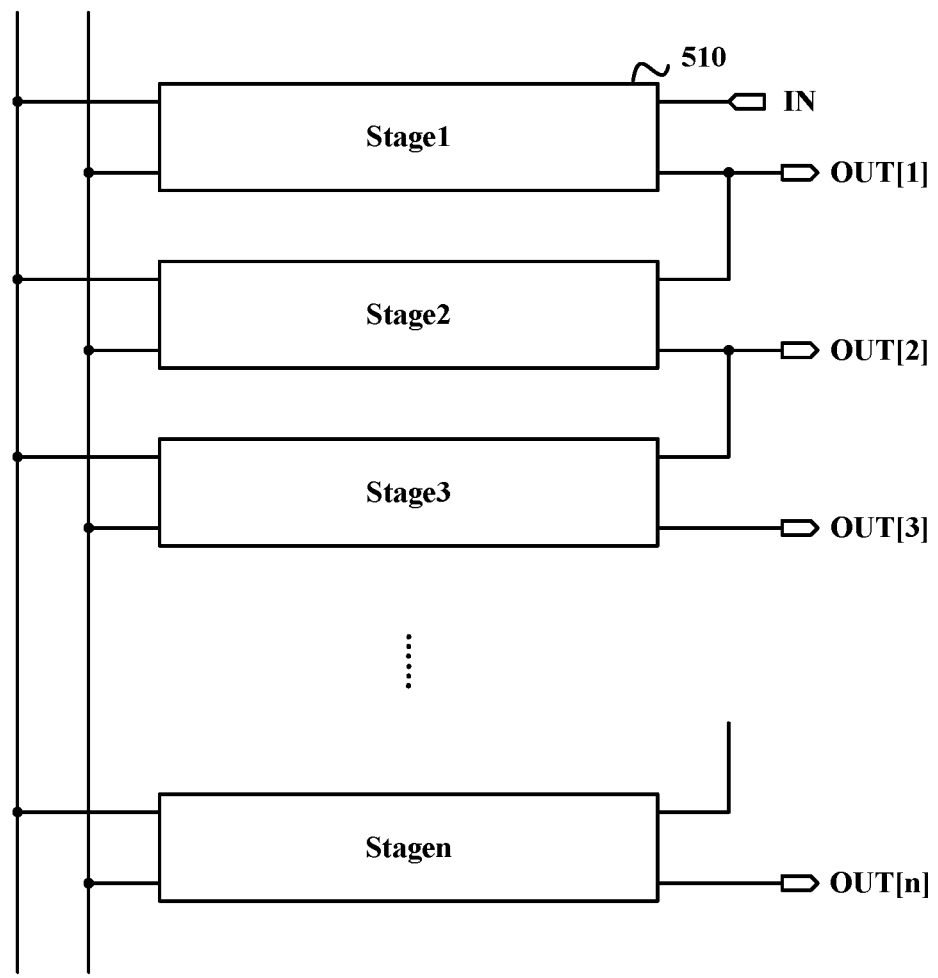
FIG. 5 illustrates a schematic structural diagram of a shift register according to an embodiment of the present disclosure.

Referring to FIG. 5, which is a schematic structural diagram of a shift register according to an embodiment of the present disclosure.

The shift register of this embodiment may include N cascaded shift register units 510. A first input signal end of any $(i+1)^{th}$ stage shift register unit receives an output signal of an $i^{th}$ stage shift register unit. Herein the i is an integer and satisfies: $1 \leq i \leq N-1$.

By means of cascading of a plurality of shift register units 510, the shift register of this embodiment may be configured to drive an organic light-emitting display panel. For example, an output of each stage of the shift register unit may be used for driving a certain row of pixels of the organic light-emitting display panel, thereby controlling this row of pixels to emit light.

It is to be noted that the shift register units included in the shift register of this embodiment may have the structure of the shift register unit as described in each embodiment above.

Figure 6:
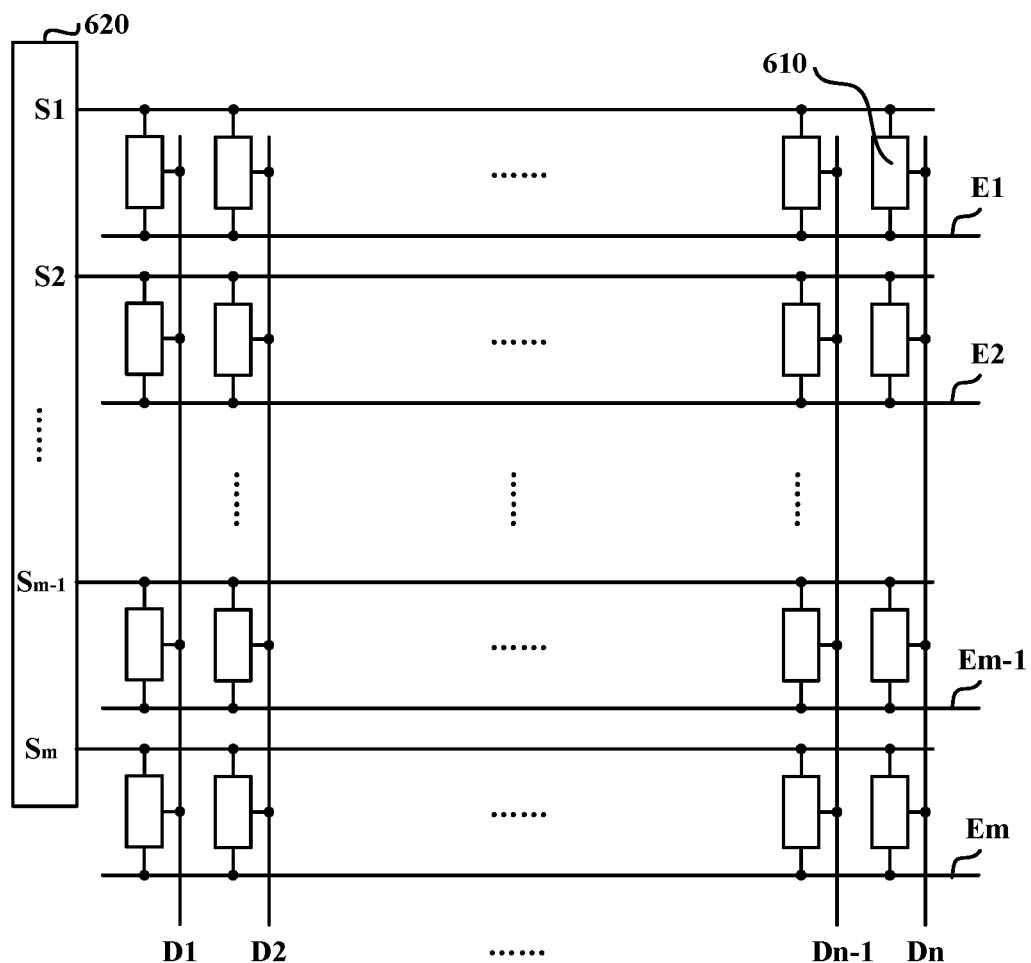
FIG. 6 illustrates a schematic structural diagram of an organic light-emitting display panel according to an embodiment of the present disclosure.

Referring to FIG. 6, which is a schematic structural diagram of an organic light-emitting display panel according to an embodiment of the present disclosure.

The organic light-emitting display panel may include a pixel array and a plurality of pixel driving circuits (not shown in the FIG. 5).

The pixel array may include m rows and n columns of pixel regions 610. Each of the pixel driving circuits includes a light-emitting diode and a driver transistor configured to drive the light-emitting diode, and each of the light-emitting diodes is positioned within each of the pixel regions 610.

The organic light-emitting display panel further includes a plurality of light emitting control signal lines. For example, FIG. 6 schematically illustrates that the organic light-emitting display panel includes m light emitting control signal lines E1~Em.

Each of the pixel driving circuits is electrically connected to one of the light emitting control signal lines and receives a light emitting control signal outputted by the shift register unit according to any one of the above embodiments.

Herein, the shift register units configured to provide light emitting control signals to the pixel driving circuits of each row of the pixel regions may be electrically interconnected using a cascade mode.

Those skilled in the art may understand that in addition to all the parts above, the organic light-emitting display panel of this embodiment may further include other widely-known structures, for example, a plurality of data lines D1~Dn. Each of the data lines may be configured to provide a data signal to the pixel driving circuits of one column of pixel regions, so that the light-emitting diodes within this column of pixel regions emit light. In addition, the organic light-emitting display panel of this embodiment may further include a plurality of gate control signal lines S1~Sn and a generation circuit 620 configured to generate each of the gate control signal lines S1~Sn. Each gate control signal is applied to the pixel driving circuits within each row of pixel regions via each of the gate control signal lines to control the pixel driving circuit to perform corresponding operations, for example, to control write-in of a data signal transmitted over each of the data lines D1~Dn.

In some alternative embodiments, each of the pixel driving circuits configured to drive a given row of pixel regions is electrically connected to a given light emitting control signal line to receive a light emitting control signal outputted by a given stage shift register unit. As shown in FIG. 6, each of the pixel driving circuits configured to drive the first row of pixel regions may be electrically connected to the light emitting control signal line E1. By analogy, each of the pixel driving circuits configured to drive the $m^{th}$ row of pixel regions may be electrically connected to the light emitting control signal line Em.

Alternatively, in other alternative embodiments, the same light emitting control signal line may further provide a light emitting control signal to each of the pixel driving circuits within multiple rows of pixel regions. For example, the first light emitting control signal may provide a light emitting control signal to each of the pixel driving circuits within the first and the second rows of pixel regions. As previously mentioned, the rising edge and the falling edge of a signal outputted by the output end of the shift register unit may be respectively correlated with the falling edge of the first clock signal and the falling edge of the second clock signal. Therefore, the pulse width and phase of an output signal (namely, the light emitting control signal herein) may be adjusted by adjusting positions of the falling edge of the first clock signal and that of the second clock signal. By adjusting the pulse width of the light emitting control signal, it may be implemented that multiple rows of pixel driving circuits share the light emitting control signal outputted by the same light emitting control signal line.

Figure 7:
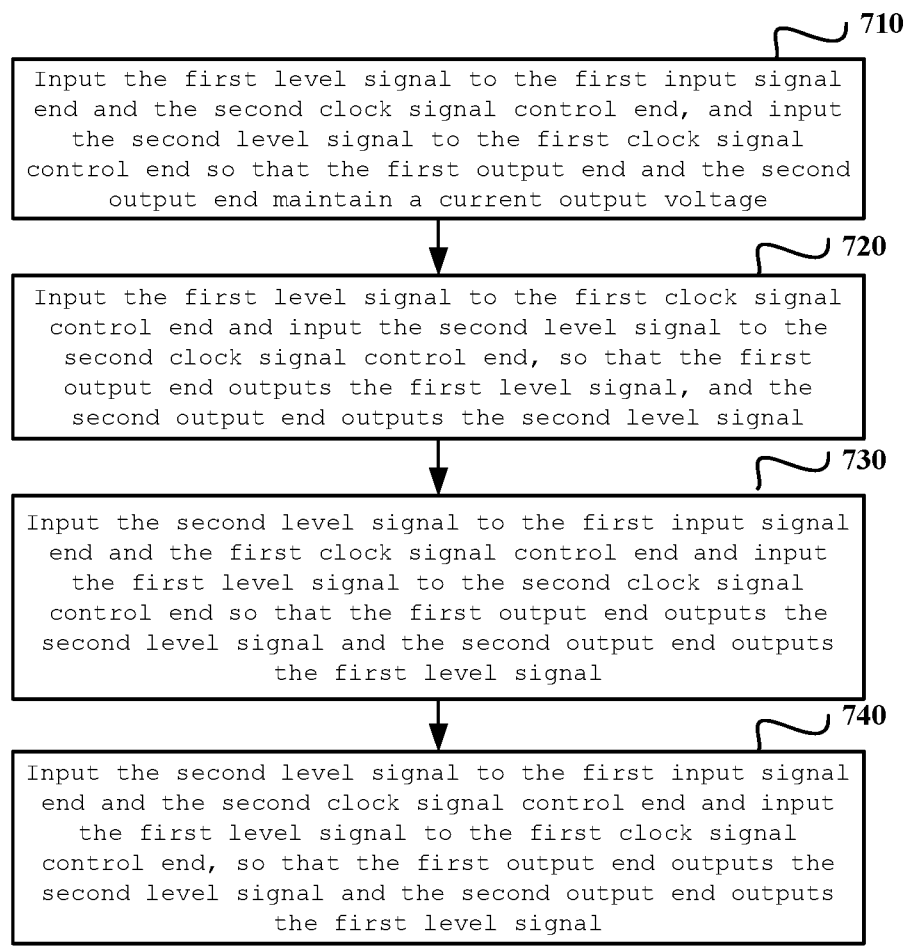
FIG. 7 illustrates a schematic flowchart of a driving method according to an embodiment of the present disclosure.

Referring to FIG. 7, which is a schematic flowchart of a driving method according to an embodiment of the present disclosure.

The driving method of this embodiment may be used for driving the shift register unit as described in each embodiment above.

Specifically, the method of this embodiment may include following steps.

Step 710: in the first phase, the first level signal is inputted to the first input signal end and the second clock signal control end, and the second level signal is inputted to the first clock signal control end so that the first output end and the second output end maintain a current output voltage and the output unit maintains a current output level.

Step 720: in the second phase, the first level signal is inputted to the first clock signal control end, and the second level signal is inputted to the second clock signal control end, so that the first output end outputs the first level signal and the second output end outputs the second level signal, and the output unit outputs a signal provided by the second level signal end VGH.

Step 730: in the third phase, the second level signal is inputted to the first input signal end and the first clock signal control end, and the first level signal is inputted to the second clock signal control end, so that the first output end outputs the second level signal and the second output end outputs the first level signal, and the output unit outputs a signal provided by the first level signal end VGL.

Step 740: in the fourth phase, the second level signal is inputted to the first input signal end and the second clock signal control end, and the first level signal is inputted to the first clock signal control end, so that the first output end outputs the second level signal and the second output end outputs the first level signal, and the output unit outputs a signal provided by the first level signal end VGL.

In this embodiment, the first level signal and the second level signal respectively may be one of a high level signal and a low level signal. It is to be understood that the high level signal and the low level signal herein are relative rather than absolute. For example, a level signal that is applied to the gate of an NMOS transistor and may turn on the NMOS transistor may be interpreted as the high level signal, and a level signal that turns off the NMOS transistor may be interpreted as the low level signal.

In addition, the working principle of the driving method of this embodiment may be understood with reference to FIG. 3 and related text description, which is not repeated herein.

According to solutions of the present disclosure, the potential of each node in the shift register unit is stable and controllable, which may avoid a problem of output logic mess of the shift register unit caused by unstable node potential when each control signal level of the shift register unit jumps. In addition, the shift register unit of the present disclosure has robustness against a transistor threshold shift. The shift register unit may still work properly within a certain threshold shift range in case of a transistor threshold shift. Thus a degree of complexity in a fabrication process of the shift register unit may be reduced.

It should be appreciated by those skilled in the art that the scope of the present disclosure is not limited to the technical solutions formed by specific combinations of the above-mentioned technical features, but also cover other technical solutions formed by any combinations of the above-mentioned technical features or equivalent features thereof without departing from the concept of the present invention, such as, technical solutions formed by replacing the above-mentioned features with technical features with similar functions as (but not limited to) those disclosed in the present disclosure.

What is claimed is:

1. A shift register unit, comprising:
   a node potential controller comprising a first output end and a second output end;
   an output unit, wherein the output unit is configured to output, based on a first control signal from the first output end, and a second control signal outputted by the second output end, a first level signal, or a second level signal; and wherein the node potential controller further comprises a first transistor, a second transistor, a third transistor, a fourth transistor, a fifth transistor, a sixth transistor, a seventh transistor, an eighth transistor, a first capacitor, a second capacitor and a third capacitor;
   wherein a gate of the first transistor, a gate of the second transistor, a gate of the seventh transistor and a first electrode of the third transistor are electrically connected to a first clock signal control end;
   wherein a first electrode of the first transistor and a first electrode of the seventh transistor are electrically connected to a first input signal end; and
   wherein a second electrode of the first transistor is electrically connected to a gate of the third transistor;
   wherein a first electrode of the second transistor being electrically connected a first level signal end, and a second electrode of the second transistor is electrically connected to a gate of the sixth transistor;
   wherein a second electrode of the third transistor is electrically connected to a gate of the fifth transistor and the gate of the sixth transistor;
   wherein a gate of the fourth transistor is electrically connected to a second clock signal control end, a first electrode of the fourth transistor is electrically connected to a second electrode of the fifth transistor, and a second electrode of the fourth transistor is electrically connected to the first output end;
   wherein a first electrode of the fifth transistor being electrically connected to an end of the second level signal;
   wherein a first electrode of the sixth transistor is electrically connected to an end of the second clock signal control, and a second electrode of the sixth transistor is electrically connected to the second output end;
   wherein a second electrode of the seventh transistor is electrically connected to the first output end;
   wherein a gate of the eighth transistor is electrically connected to the first output end, a first electrode of the eighth transistor is electrically connected to the second level signal end, and a second electrode of the eighth transistor is electrically connected to the second output end;
   wherein two ends of the first capacitor are connected respectively to the second clock signal control end and the first output end;
   wherein two ends of the second capacitor are connected respectively to the gate of the fifth transistor and the second output end; and
   wherein two ends of the third capacitor are connected respectively to the first electrode of the fifth transistor and the gate of the third transistor.

2. The shift register unit according to claim 1,
   Wherein the output unit further comprises a ninth transistor and a tenth transistor;
   wherein a gate of the ninth transistor is electrically connected to the second output end, a first electrode of the ninth transistor is electrically connected to the second level signal end, and a second electrode of the ninth transistor and a second electrode of the tenth transistor are electrically connected to an output end of the output unit; and
   wherein a gate of the tenth transistor is electrically connected to the first output end, and a first electrode of the tenth transistor is electrically connected to the first level signal end.

3. The shift register unit according to claim 1, wherein the third transistor is a double-gate transistor.

4. The shift register unit according to claim 2, wherein, the first transistor, the second transistor, the third transistor, the fourth transistor, the fifth transistor, the sixth transistor, the seventh transistor, the eighth transistor, the ninth transistor and the tenth transistor are PMOS transistors.

5. The shift register unit according to claim 2, wherein the first transistor, the second transistor, the third transistor, the fourth transistor, the fifth transistor, the sixth transistor, the seventh transistor, the eighth transistor, the ninth transistor and the tenth transistor are NMOS transistors.

6. The shift register unit according to claim 4, wherein a first clock control signal inputted by the first clock signal control end and a second clock control signal inputted by the second clock signal control end are mutually-inverted signals.

7. The shift register unit according to claim 5,
   wherein a first clock control signal from an end of the first clock signal control and a second clock control signal from an end of the second clock signal control are mutually-inverted signals.

8. The shift register unit according to claim 2,
   wherein a capacitance value of the first capacitor is positively correlated with a width-to-length ratio of the tenth transistor.

9. The shift register unit according to claim 1, wherein, a width-to-length ratio w/l of the first transistor satisfies:

$$1.5 \leq w/l \leq 2.0.$$

10. An organic light-emitting display panel comprising a shift register unit according to claim 1, comprising:
    a pixel array comprising m rows and n columns of pixel regions;
    a plurality of light emitting control signal lines;
    a plurality of pixel driving circuits, each of the pixel driving circuits comprising a light-emitting diode and a driver transistor configured to drive the light-emitting diode, each of the light-emitting diodes being positioned within one of the pixel regions,
    wherein the plurality of pixel driving circuits each is electrically connected to one of the light emitting control signal lines and receives a light emitting control signal from the shift register unit.

11. The organic light-emitting display panel according to claim 10,
wherein the plurality of pixel driving circuits each is configured to drive an associated row of pixel regions and is electrically connected to an associated light emitting control signal line to receive a light emitting control signal from an associated stage shift register unit.

12. A driving method for driving the shift register unit according to claim 1, comprising:
inputting the first level signal to an end of the first input signal and an end of the second clock signal control;
inputting the second level signal to the first clock signal control end in a first phase so that the first output end and the second output end maintain a current output voltage and the output unit maintains a current output level;
inputting the first level signal to the end the first clock signal control, and inputting the second level signal to the end of the second clock signal control, in a second phase so that the end of the first output provides the first level signal, the end of the second output provides the second level signal, and the output unit provides a signal provided by an end of a second level signal;
inputting the second level signal to the end the first input signal and the end of the first clock signal control;
inputting the first level signal to the end the second clock signal control, in a third phase so that the first output end outputs the second level signal, the second output end outputs the first level signal, and the output unit outputs a signal provided by an end of the first level signal; inputting the second level signal to the end of the first input signal and the end of the second clock signal control; and
inputting the first level signal to the end of the first clock signal control in a fourth phase so that the first output end provides the second level signal, the second output end provides the first level signal, and the output unit outputs a signal provided by the end of the first level signal.

* * * * *